United States Patent [19]
Theodoseau

[11] Patent Number: 5,872,797
[45] Date of Patent: *Feb. 16, 1999

[54] BURN-IN SIGNAL PATTERN GENERATOR

[75] Inventor: Philip Theodoseau, Richmond, Vt.

[73] Assignee: International Business Machines Corporation, Armonk, N.Y.

[21] Appl. No.: 758,419

[22] Filed: Dec. 2, 1996

[*] Notice: This patent issued on a continued prosecution application filed under 37 CFR 1.53(d), and is subject to the twenty year patent term provisions of 35 U.S.C. 154(a)(2).

[51] Int. Cl.⁶ .................................................. G01R 31/28
[52] U.S. Cl. ..................................... 371/27.1; 395/421.07
[58] Field of Search ................................. 371/27.1, 27.2, 371/22.34, 22.36, 25.1, 27.5, 27.7, 22.6, 57.2, 22.1, 22.33, 22.5, 27.6; 395/183.06, 183.08, 421.07, 421.09, 421.1, 500; 364/580, 765, 490, 717.5, 718; 324/765

[56] References Cited

U.S. PATENT DOCUMENTS

| | | | |
|---|---|---|---|
| 4,586,181 | 4/1986 | Shimizu | 371/27 |
| 4,682,330 | 7/1987 | Millham | 371/20 |
| 4,754,215 | 6/1988 | Kawai | 324/73 R |
| 4,994,732 | 2/1991 | Jeffrey et al. | 324/73.1 |
| 5,010,552 | 4/1991 | Dias et al. | 371/27 |
| 5,072,178 | 12/1991 | Matsumoto | 324/158 R |
| 5,097,468 | 3/1992 | Earlie | 371/15.1 |
| 5,271,015 | 12/1993 | Akiyama | 371/21.5 |
| 5,285,453 | 2/1994 | Gruodis | 371/27 |
| 5,430,736 | 7/1995 | Takeoka et al. | 371/23 |
| 5,453,995 | 9/1995 | Behrens | 371/27 |
| 5,475,624 | 12/1995 | West | 364/578 |
| 5,479,415 | 12/1995 | Staiger | 371/27 |
| 5,499,248 | 3/1996 | Behrens et al. | 371/22.1 |
| 5,499,250 | 3/1996 | Ingalls et al. | 371/28 |
| 5,524,114 | 6/1996 | Peng | 371/22.1 |
| 5,563,526 | 10/1996 | Hastings et al. | 326/37 |

OTHER PUBLICATIONS

"Algorithmic Pattern Generation at the Tester"; IBM Technical Disclosure Bulletin, vol. 32, No. 6A; Nov. 1989; N. N. Ngo et al.; pp. 76–79.

*Primary Examiner*—Robert W. Beausoliel, Jr.
*Assistant Examiner*—Nadeem Iqbal
*Attorney, Agent, or Firm*—Whitham, Curtis & Whitham; Tiffany Townsend, Esq.

[57] ABSTRACT

Hardware tester and burn-in tools are emulated by providing a user-specified nested sequence of counters, logical combination of the counter outputs and generation of corresponding vectors for application to exercise an integrated circuit device. The vectors are generated in accordance with user-specified parameters and stored in static random access memory until called for application to the integrated circuit. The parameters, preferably specified through use of a graphic user interface, provide an extremely compressed representation of the vectors themselves. Provision is made to accommodate any of a plurality of waveform conventions directly in the vector. An interface table is preferably used to arbitrarily allocate bits of the vector to pins of the integrated circuit device and any of a plurality of clock signals and phases can be provided to any pin. Sequences of vectors may also be generated for each combination of counter output states in accordance with desired memory functions.

18 Claims, 5 Drawing Sheets

BURN-IN SIGNAL PATTERN GENERATOR

BACKGROUND OF THE INVENTION

1. Field of the Invention

The present invention generally relates to digital signal pattern generators and, more particularly, to signal pattern generators for stressing memory and logic devices during burn-in.

2. Description of the Prior Art

In recent years, the increased speed and functionality, improved performance and economy of manufacture available from increased integration density in integrated circuits has led to increased numbers of designs of memory and logic circuits. Further, improvements in lithographic techniques and innovations of designs for electronic elements, such as transistors and capacitors, has led to integrated circuit designs which exploit them. At the same time, however, product specifications for integrated circuits have become more stringent and inherent variability of manufacturing processes has increased the need for careful testing of integrated circuit designs and individual devices. At the same time, testing has become far more complex due to the increased numbers of electronic elements contained in an integrated circuit package or module.

Unavoidable manufacturing process variability, in particular, presents substantial difficulty and expense in delivering product having tight tolerances within the product specification. Not only must the product be within specified operational tolerances as manufactured but the manufacturer must assure that the operating tolerances of the product will remain within those tolerances over its useful lifetime. Accordingly, it has become the common practice to provide testing of the individual devices both before and after an extended process called "burn-in" during which the devices are electrically and thermally stressed.

The complexity of integrated circuits at the present state of the art has made exhaustive testing impractical and led to the development of test signal patterns which have an increased likelihood of revealing particular types of defects or decreased operating margins. Even these signal patterns may require substantial periods of time to execute on hardware testers. Since such hardware testers can test only one or a very few devices at a time, throughput is low. Further, the tester must provide signal patterns which are specific to a particular integrated circuit design and programming of a tester for any particular integrated circuit design is difficult and arduous, particularly in development of the testing algorithm and changing the algorithm on the tester when a different design is to be tested.

On the other hand, signal patterns applied to a device for burn-in must be more exhaustive and lengthy to execute but, nevertheless, specific to each design in much the same manner as test patterns but for different reasons. For example, a particular memory design exercising particular groups of memory cells in particular areas of the chip may result in a desired electrical and/or thermal pattern across the chip. Periodic testing is generally included in the burn-in process (although generally at a lower level than the testing described above) so that devices which do not stabilize their operational characteristics within tight tolerances during burn-in can be discarded. Throughput of burn-in apparatus, also referred to as stress systems, is maintained through the fact that the signal patterns can be applied simultaneously to a large number (e.g. several hundreds or thousands) of devices.

Stress systems have become developed into two distinct types intended for use with logic and memory devices, respectively. Each of these two types of stress systems provides a certain degree of hardware economy specific to either logic or memory systems. However, both are difficult to program for a particular integrated circuit device. Further, neither type of stress system can be used with integrated circuit devices other than the type for which the tester is intended.

Specifically, for logic devices, a stress system generally includes a pattern of signals stored in an extensive memory (e.g. vector length (256, 512, etc.)×1 Megabits to 4 Megabits) which is cycled through in a scanning fashion by counters. In this way, multi-bit signal patterns, sometimes referred to as vectors, are obtained and can be applied to the pins of a logic device. Since the signals are simply combinations of logic bits, any bit in the combination could, in theory, be applied to any pin of the device. However, to achieve the desired burn-in function, the bits of each vector are programmed into memory, generally a static random access memory for high reading rate, in accordance with the pin of the logic device to which it is to be applied. By the same token, there are generally only limited provisions for applying timing related signals (e.g. pulses needed to properly synchronize the logic device) to the device. While the signal patterns can be overwritten by downloading new pattern data into the tester's memory, logic stress testers generally do not have the ability to change the stored patterns dynamically (e.g. "on the fly") during normal operations.

In the case of stress systems adapted for memories, the hardware vector generator must provide both an address and data in a synchronized fashion as well as at least one clock phase. An arithmetic logic unit (ALU) synchronized to a clock phase generally provides an address and data pattern to be applied to the device or module. Since separate address and data vectors and a clock function, which has different signal rise and fall timing compared to the address and data signals, must be provided, each channel (each carrying a respective bit of the address and data vectors or a clock signal) is specific and dedicated to particular pins of the memory, reducing the flexibility of the stress system to accommodate different designs and pin-out arrangements. As with logic testers, programming of the arithmetic logic units is difficult and time-consuming and no provision is generally made for modification of the programmed functions of the ALU's to generate address and data vectors modified from the original vector programming.

It should also be noted in regard to either type of tester or stress system described above that digital circuits may be arranged to operate in response to any of a number of signal waveforms conveying a particular, arbitrary signal pattern. Well-known forms of such signal waveforms are so-called non-return to zero (NRZ), return to zero (RZ), return to one (RO) and return to complement (RC), among others. While it is generally the case that a single digital circuit device will use only one of these waveform conventions and digital signal patterns can be produced in accordance with any of these conventions fairly simply with level shifters, pulse choppers and the like, the number of channels required (e.g. 256, 512, etc.) for testing or stressing current digital circuits requires a substantial amount of circuit hardware to be provided. Further, even in current circuits it could be considered, for example, that clocked circuits responding to a positive or negative transition of a signal require signals according to more than one of these conventions: NRZ for data and RC for the clock in this example. Therefore, it is possible or even likely that new digital circuit designs could exploit use of different signal waveform conventions on different arbitrary pins. Such a facility is not generally provided in known testers or stress systems, even on a basic hardware level and the provision of selectivity of waveforms on a channel-by-channel basis would clearly involve substantial complexity and hardware overhead even to accommodate a relatively few signal waveform conventions. In testers in which such a facility is provided, the facility is obtained at only by a substantial additional level of complexity.

Additionally, modern memory circuits have provided arrangements by which more than one memory access can be achieved in a single memory operational cycle, such as a so-called "write-before-read" function and the like. Additionally a further memory access in a single memory access cycle can be provided by providing a further row and column address through a multiplexer in an operation known as "muxing". Since the muxing operation involves increased numbers of switching operations and digital transistor circuits dissipate heat largely during the transition time of a signal between logic states, electrical and thermal stress can be most readily applied to a memory circuit utilizing the muxing operation. However, known logic stress systems do not generally provide such a facility and, if provided, such muxing is achieved only by the connection of further external hardware pattern generators to the stress system and usually over only a relatively small number of channels.

From the above differences in requirements for driving or exercising each of logic devices and memory devices, it can be readily understood that development of a stress or test system usable with both, particularly where the memory device is embedded within the logic device, would involve substantial hardware unused or other complications engendered when the tester or stress system is applied to either type of device. For example, provision of muxing operations is of substantial complexity even when channels are dedicated to particular device pins but would not generally be used with logic devices. Conversely, in memories where address and data vectors must be separately applied, dedication of pins provides substantial simplification of hardware even allowing for substantial loss of flexibility since assuring that each necessary pin would be driven cannot be otherwise assured within the capabilities of known testers and stress systems. Therefore, the need for different types of testers and stress systems for logic and memory devices as well as different arrangements of testers and stress systems for memories having different pin-out arrangements has required substantial hardware costs in the integrated circuit industry.

Further, known tester and stress systems utilize a fixed sequence of signal patterns which may be repeated. This may or may not be optimal for either testing or burn-in. For example, a binary sequence of signal patterns will develop radically different switching rates and, hence, power dissipation patterns in, for example, an array of switching transistors to which the bits of the pattern are respectively applied. While some hardware arrangements for generating, for example, pseudo-random signal sequences which may statistically provide more equalized average switching rates among transistors, the number of channels necessary in a tester or stress system would make application of such arrangements prohibitively expensive in a tester or stress system capable of exercising modern digital circuits. Further, any such arrangement must also provide for assurance that the sequence of signal patterns provided will be suitably exhaustive for burn-in or to serve the purposes of a particular test sequence.

SUMMARY OF THE INVENTION

It is therefore an object of the present invention to provide a generalized, programmable, tester/stress system capable of variable signal pattern generation under user control to minimize tester and stress system tooling.

It is another object of the invention to provide a simplified user interface to a tester/stress system to allow simple, rapid and convenient control of generation of a large number of signal patterns for application to a digital circuit device by a highly condensed representation thereof.

It is another object of the invention to provide for emulation of hardware signal pattern generators and additionally providing full selectivity of function (including driving or signal detection) for any channel, fully selectable correlation of channels with pins and full selectivity of clocking, waveform, phase, and waveform convention on each channel.

It is yet another object of the present invention to provide a stress system for memory devices which can exercise a muxing function thereof, if provided in the memory device.

It is a yet further object of the invention to provide vector scrambling in a signal pattern generator of a tester or stress system to indicate the defect to which the test is directed.

In order to accomplish these and other objects of the invention, a system and method are provided for specifying a counting function of each of a plurality of counters, providing ordered nesting of counting of the plurality of counters, developing logic signals from outputs of the plurality of counters, specifying a waveform convention in accordance with each of the logic signals, and outputting a vector as an input to an integrated circuit in accordance with the logic signals and the waveform convention.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
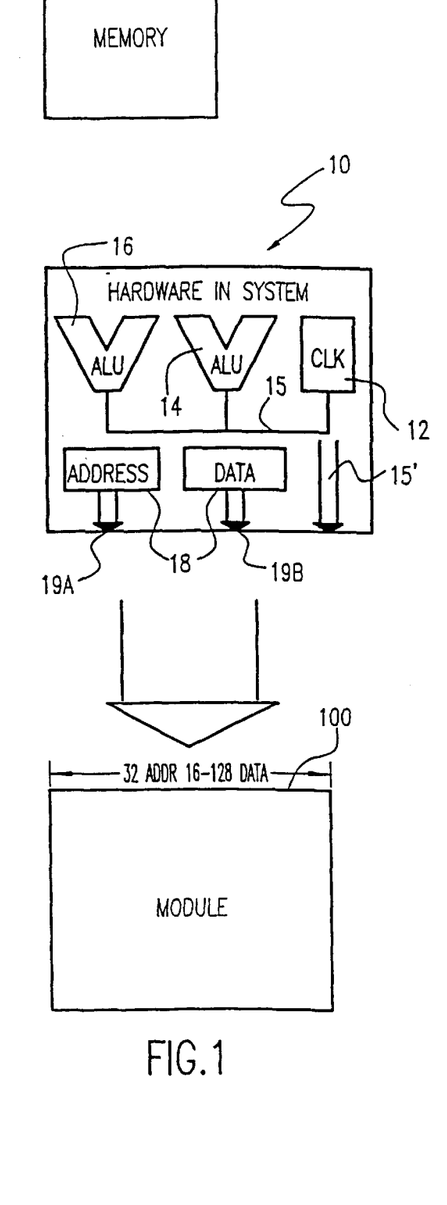
FIG. 1 is a high-level schematic representation of features of known memory stress systems.
Figure 2:
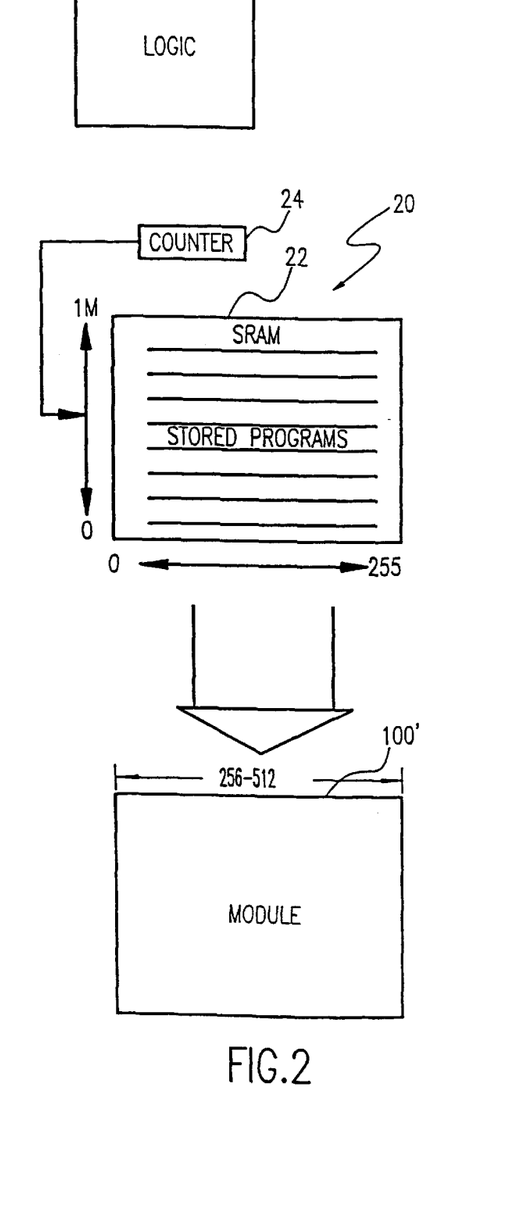
FIG. 2 is a high-level schematic representation of features of known logic stress systems.

Referring now to the drawings, and more particularly to FIGS. 1 and 2, there is shown a high-level schematic representation of salient features of known memory stress systems and logic circuit stress systems, respectively, insofar as those features will facilitate an understanding of the present invention. It is to be understood, however, that these representations are highly conceptualized in the illustration provided and the illustration is arranged principally to facilitate an understanding and appreciation of the invention. Therefore, while the illustrations represent features of known stress systems, no portion of either FIG. 1 or FIG. 2 is admitted as prior art in regard to the present invention.

The stress system 10 for memories shown in FIG. 1 includes a clock 12 of at least a single phase but preferably of plural phases which is provided to ALUs 14 and 16 as indicated at 15 to synchronize operation and outputs thereof. The clock signal is also provided as an output 15' to memory module 100. ALUs 14 and 16 preferably include internal sources of binary signals and combinatorial logic which may be programmed to provide signal patterns or vectors which are generally buffered and processed as desired (e.g. level shifting, gating, etc. for accommodating a waveform convention, as discussed above) as illustrated at 18 for both address and data. Thus two separate vectors and necessary clock signals may be output to memory module 100. These vectors and clock signals must be kept separate and the bits thereof in order (or organized by function in the case of plural clock phases) and thus each channel of outputs 15', 19a and 19b is dedicated to a particular pin on memory device 100. There is thus no facility for variation of the correlation of channels and pins or to select functions such as between input or output for any pin.

Further, while ALUs 14 and 16 may be of a generalized and programmable form, programming of the sources of binary signals and the combinatorial logic applied thereto is arduous and complex to obtain a desired sequence of desired signal patterns since synthesis of both the binary signal sequences and the combinatorial logic must be performed. Moreover, any particular programming is not readily modified to alter or refine the sequence of signal patterns.

The stress system for logic circuits schematically illustrated in FIG. 2 principally consists of an extensive memory array 22, preferably in SRAM for rapid access. The memory array illustrated must include a memory cell for each bit of the required vector to be input to logic module or circuit 100', here shown to be 256 bits wide as a line of the memory array (but not critical to the practice of the invention). As many lines of the array as are necessary to the desired signal pattern sequence are also required. This number is indicated as 1M which is similarly not critical to the practice of the invention. However, it is preferred that the number of lines be as large as possible. It can be readily appreciated that an extremely large number of lines would be required ($2^{256}$ in this case) to provide an exhaustive set of signal patterns although some known techniques such as inversion can be used to effectively increase the number of combinations of bits which can be provided from the memory array in sequence under control of counter 24 or any other type of scanning device.

As indicated above, the outputs of the logic circuit stress system 20 are simply logic level signal, although well-synchronized, and can be applied to any pin of the logic circuit 100'. However, there is no facility for providing waveform shaping, chopping or the like on individual channels or selective accommodation of signal waveform conventions discussed above. More importantly, there is no facility for modification of the vector sequence or the signal pattern or even signal pattern generation other than by overwriting the memory array with another vector sequence. As with the memory device stress system, there is no facility provided for selectivity of function for any channel or pin, particularly selectivity between input and output functions for a pin.

Figure 3:
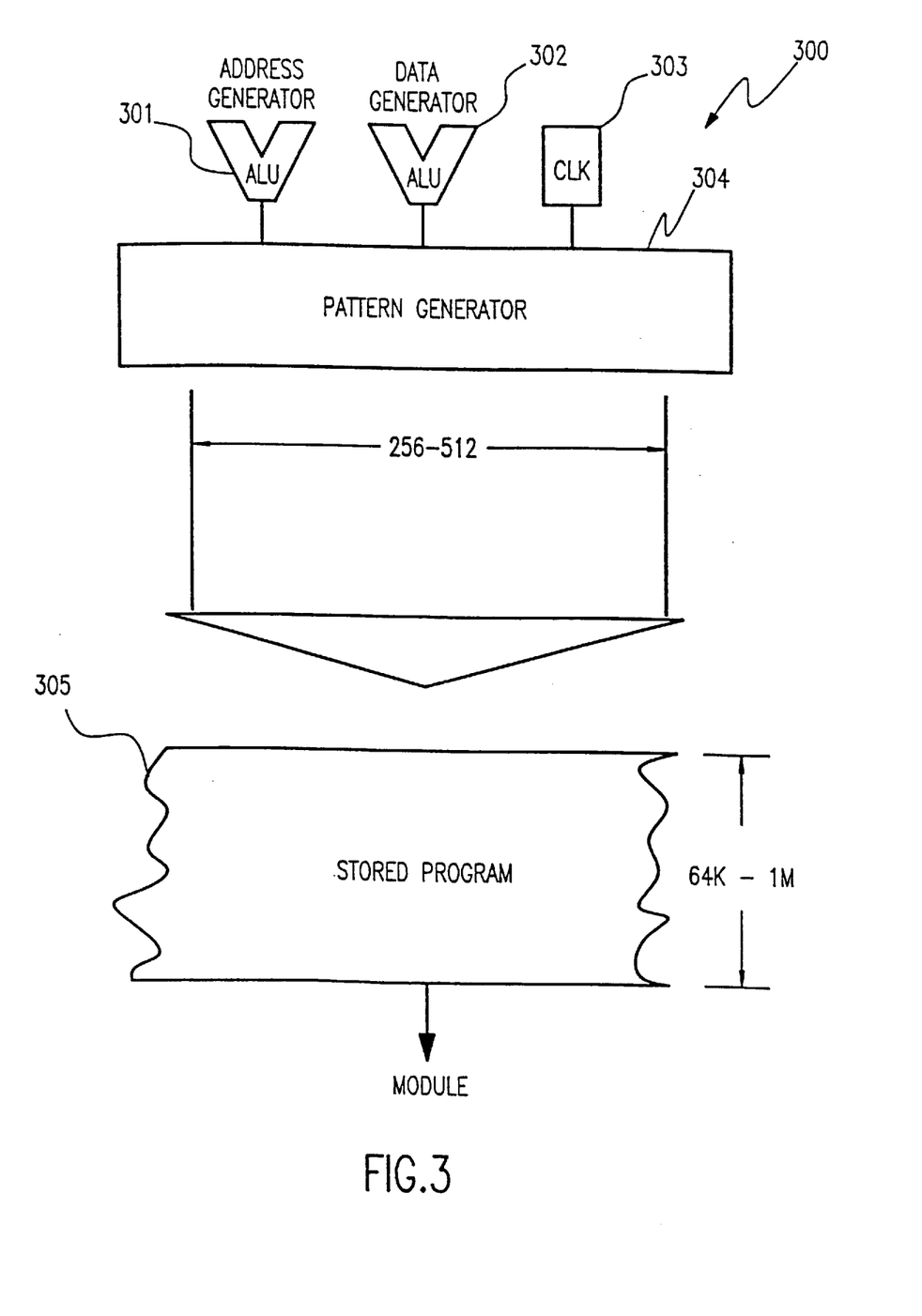
FIG. 3 is a high level schematic diagram of the invention.

Referring now to FIG. 3, the tester/stress system 300 of the invention will now be described. It is to be understood that, while the invention is preferably embodied in software executed on a general purpose or special purpose digital data processor or computer to allow maximum flexibility and a user interface of a familiar form, the schematic illustration of FIGS. 3 and 4 indicate how the invention could be implemented in hardware, if desired, as will be evident to those skilled in the art in view of the following description. Further, if the invention is implemented on a general purpose or special purpose digital computer, as is preferred, the indicated counters, ALUs, registers and memory would be implemented by the configuring thereof incident to the execution of the software as will be similarly evident, in view of the following description, to those skilled in the art.

The tester/stress system of the invention basically includes at least a plurality of ALUs 301, 302 (generally a separate ALU for each channel and additional complex interconnection circuitry to synchronize them) and a clock 303 as provided in the architecture illustrated in FIG. 1. Outputs of all three of these elements are provided to a pattern generator 304 under appropriate control (control not shown in FIG. 3 in the interest of clarity) which builds signal patterns which are then stored in memory 305. Particularly if implemented on a special or general purpose computer, the ALUs 301, 302 will be adequately synchronized by the system clock. Clock 303 can be emulated by signal synthesis from the system clock or by one or more synchronous oscillators such as phase locked loops which may be provided internally of or externally to the computer.

The pattern generator 304, under appropriate control, as will be discussed in detail below, generates a sequence of vectors which are stored in memory 305, preferably implemented as a direct access storage device (DASD), from which they can be read and output to one or more devices. Advantageously, the memory 305 can also store one or more files which contain the appropriate control commands for generating the vectors including modifications thereto as may be implemented by the user through the use of the invention.

Figure 4:
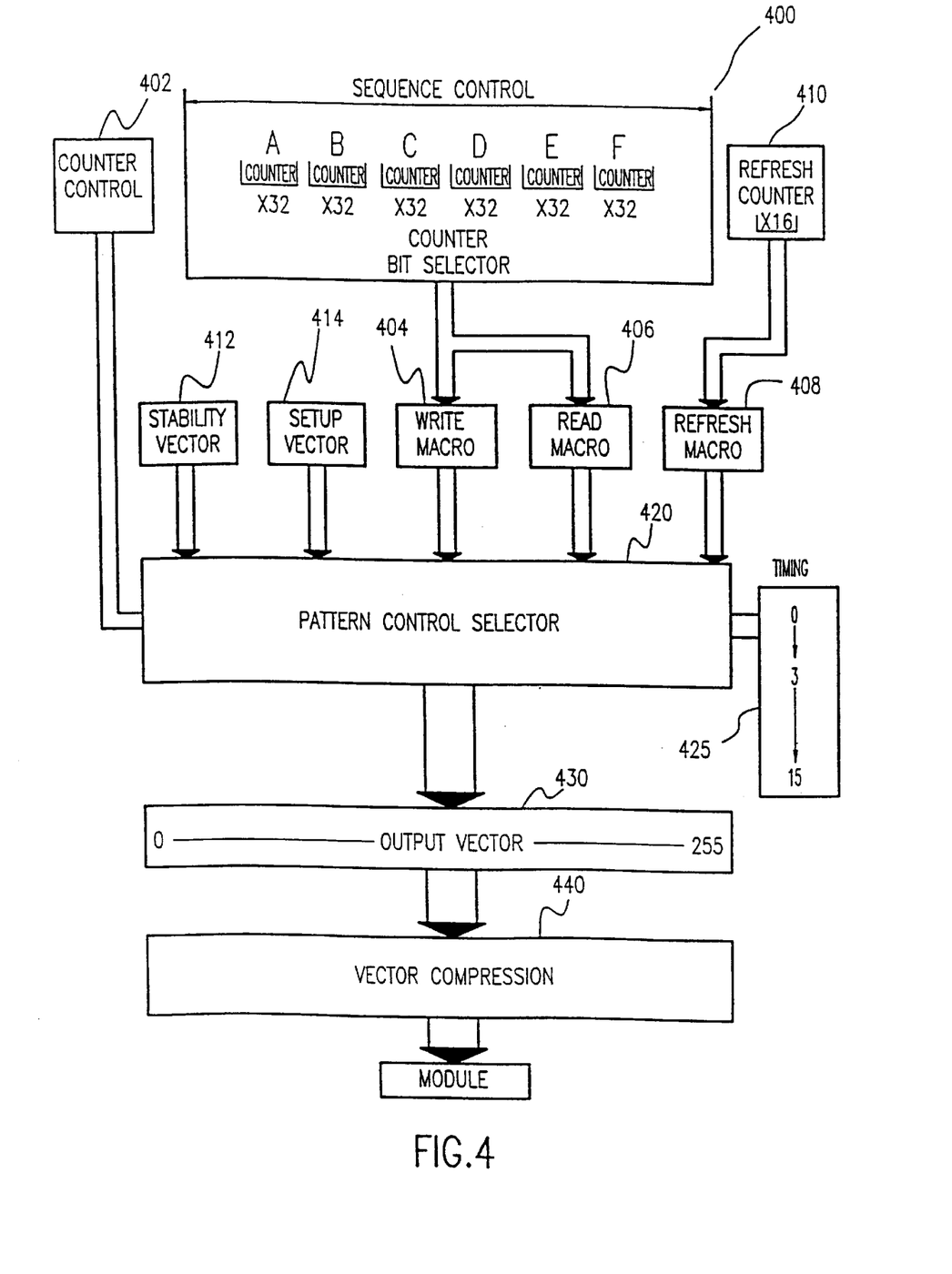
FIG. 4 is a more detailed schematic diagram of a preferred form of the invention.

Referring now to FIG. 4, a preferred form of the invention, including control structure omitted from FIG. 3, will now be described in detail. Initially, it should be understood that only a relatively few basic sequences of vectors are necessary to stress or test a memory or logic device although those sequences may be very long and may vary between device designs. Generally, for a logic device, a substantial fraction of the possible combinations of input logic states with suffice for either purpose. For memory, provision of signals to perform unique address access, write array, read array, variable retention testing and multiple read per address with a sequence of addresses and variable data are necessary for either purpose. (Write array, read array and variable retention testing are different operations involved in the refresh process and may be hereinafter collectively referred to as a "refresh macro". Multiple read per address is an alternative term to muxing, alluded to above.)

However, the addresses and data in relatively short sequences will be specifically designed to reveal certain potential defects for testing and substantially longer sequences of potentially different addresses and data will be specifically designed to exercise specific portions of memory at chosen relative frequencies or rates for burn-in. It may also be desirable or necessary for a particular memory design to provide a signal pattern or vector for initializing programmable logic in the memory and/or a vector referred to as a stability vector which is applied to the memory to achieve and maintain the idle state when the memory is not being accessed.

To develop these patterns a plurality of counters are preferably provided in bit selector 400. The number and width of the counters is not critical to the practice of the invention but six counters (A–F) of 32-bit width is considered to be preferred for adequate flexibility for current and foreseeable memory designs, as illustrated, and, additionally, refresh counter 410, which may be much smaller. The principles of the invention are, of course, applicable to any number of counters of any size and it is expected that a greater number of wider counters will be required for future memory designs.

Specifically, the values developed by a combination of the outputs of these counters at any time is used to develop a vector in accordance with a counter control 402 and one of read macro 406, write macro 404 or refresh macro 408 as may be selected by pattern control selector 420, which can also select preset stability or set-up vectors which are unique to each particular memory or logic circuit design. (For purposes of this description, a macro is defined as an algorithm pre-programmed by the user and callable by name.) That is, an algorithm, in a basic form and with default parameters and values, is resident in the pattern generator 304 which the user can pre-program, preferably through the use of a graphic user interface, altering default parameters and values as desired, to iteratively build a specific version of each of the write and read macros 404, 406 in response to combinations of signals preferably developed by counters, as will be described below. The macros then build a plurality of patterns which are stored in memory 430 and read out in sequence, when called. Each of counters A–F are arranged to count by any desired increment, n, where n can be any number from 1 up to the trivial case of the capacity of the counter. For example, where n=3, the counter output (in decimal notation) would be 0, 3, 6, 9, 12, 15, . . . , etc. Further, it is preferred that the counter be controllable to count either up or down and that the sequence by identically repeatable or rolled over (e.g. continuing to count from a current value but without carry other than for indicating, by overflow, the completion of counting at a particular counter) when a programmable count or counter width is reached (e.g. 0, 3, 6, . . . , 27, 30, 0, 3, 6, etc. or 0, 3, 6, . . . , 27, 30, 1, 4, 7, . . . etc.).

The counters are preferably articulated in nested loops as is well-understood in the art with overflow indicated the completion of counting whereupon the counter in the loop containing the overflowing counter is incremented and the loops executed until done. By virtue of the nesting of the loops, the programmability of the width of each counter in any order and the arbitrary counting increment, n, of each counter and arbitrary starting value for each counter sequence, any sequence of combinations of counter outputs can readily be achieved by specification of only a small number of parameters for each counter. Using these parameters as arguments of several counter control commands can readily be accommodated by a simple display interface and input such as a keyboard. A typical default menu for an exemplary six counters in such an interface might appear as:

| | | |
|---|---|---|
| Counter A inc/dec | 1++ or 1 + n | |
| width = 32 | | |
| user description | | |
| Counter B inc/dec | 1++ or 1 + n | |
| width = 32 | | |
| user description | | |
| Counter C inc/dec | 1++ or 1 + n | |
| width = 32 | | |
| user description | | |
| Counter D inc/dec | 1++ or 1 + n | |
| width = 32 | | |
| user description | | |
| Counter E inc/dec | 1++ or 1 + n | |
| width = 32 | | |
| user description | | |

-continued

| | | |
|---|---|---|
| Counter F inc/dec | 1++ or 1 + n | |
| width = 32 | | |
| user description | | |
| Order: A → B → C → D → E → F | | | in which the default parameters (e.g. 1, n, 32 and user description, the latter being preferably selectable from a menu) can be individually selected and modified. Likewise, the order specified in the last line of the interface may be modified to control nesting order as desired by the user.

It was noted above that any sequence of combinations of counter outputs can be developed. However, if n were to become relatively large compared to counter capacity, the length of the possible output sequence while counting through nested loops might be shortened. Also, for exercising of a particular small region of, for example, a memory array, a counter width might need to be selectively reduced which would also tend to shorten the available counter sequence through nested loops. Therefore, while not necessary to the practice of the basic invention, it is considered desirable to provide for Boolean combination of counter outputs. For example, it is considered preferable to provide the freely programmable combinations of AND (&), OR (|), XOR (^), NOT (!) left shift (<<N) and right shift (>>N) by an arbitrary number N of bits. Further, any signal on any channel can be latched at either logic level or placed in a "don't care" or tri-state state (X) and, as pointed out above, any channel can be assigned to any pin by the write or read macro under user control. Thus the commands as user-developed might appear though the graphical user interface as:

row_add_0==A0 row_add_1==A7 & B4 | !C5 row_add_2==A2

. . .

row_add_10==always low

. . .

row_add_31==A0 & B1 col_add_0==B0 col_add_1==C3

. . .

col_add_10==always high

. . .

col_add_31==D4<<3

Since these tables may likely be longer than the number of rows available on the display screen, it is considered to provide for scrolling and GOTO in the display control.

Figure 4A:
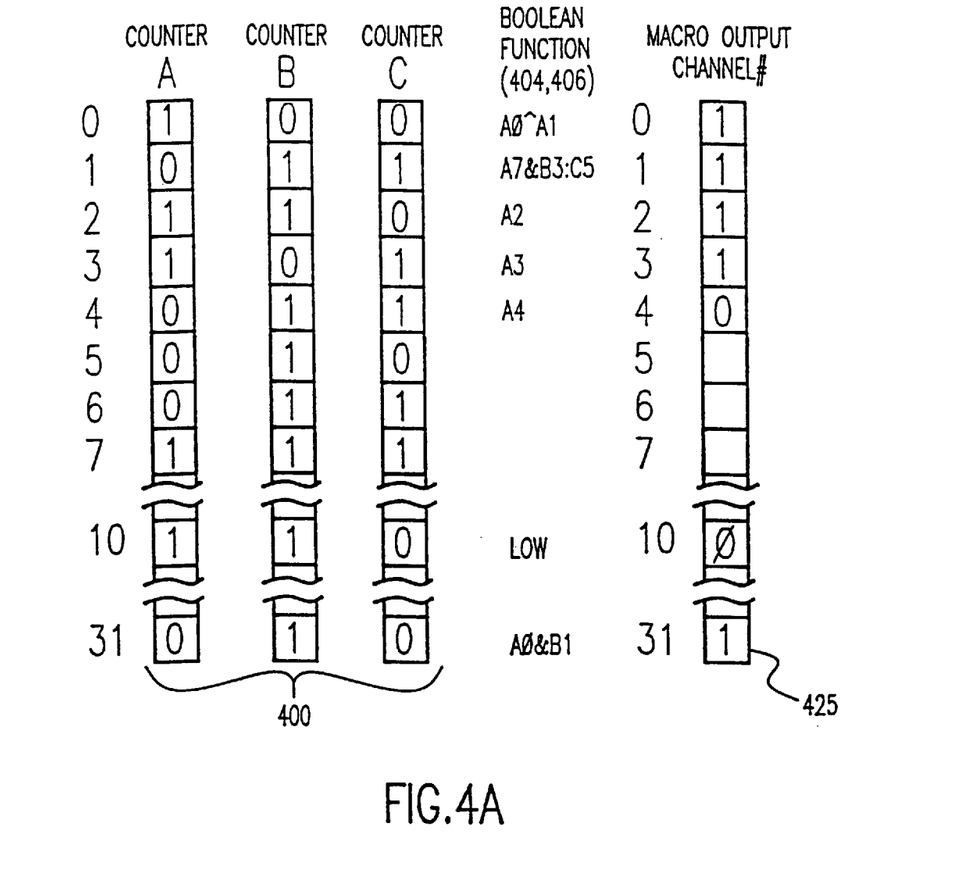
FIG. 4A shows a portion of FIG. 4 relating the bit selector and a macro thereof to produce an output bit pattern.

To relate these commands to the schematic of FIG. 4, reference is now made to the schematic representation of a portion of FIG. 4A in which a portion of counters A–C (each assumend to be 32 bits wide) of bit selector 400, the Boolean functions described above and all channels of the corresponding macro output are shown. The contents of counters A–C at an arbitrary point in time during the generation of bit patterns is also indicated. The Boolean expressions generated at the will of the operator or imported as described above are applied to the states of each bit of the counters A–C (or A–F) to develop the output state of the macro in each channel. For example, the Boolean expression for channel 0 is A0 ^ A1 and from the bits 0 and 1 of counter A, an output of 1 for channel 0 results. Similarly, the Boolean function of channel 1 look to particular bits of all of counters A–C to derive an output while the Boolean function of channels 2–4 is simply the states of the corresponding bit of counter A. Channel 10 output is defined as always low and channel 31 looks to particular bits of counters A and B only to derive an output.

The above-described arrangement is sufficient for development of logic signals and pin assignments for address input pin functions. The actual channel identity may be of no importance to the user and may be made transparent to the user in the interface. Channel assignment is readily accomplished in the invention, for example, assigning channels in order as defined in the above and following tables or any other order. Thus, the identity of each channel is uniquely associated with the pin name (in the left-hand column of the above tables) and the function of the channel is defined by a user-defined logic statement (in the right-hand column) of how the logic value of the signal in that channel is to be derived. Alternatively, and preferably for greater generality and controllability of the system of the invention, the interface may provide such an ordering of channel assignments, preferably in the form of an interface table, with an arbitrary ordering of channel assignments, such as that discussed above, as default channel assignments which can then be altered at the will of the user. In the latter case, it is preferable to provide for checking of pin assignments to avoid duplication. The manner in which the checking is done is not important to the practice of the invention. The channel assignment interface table can also specify the pins to which power and clock signals are to be applied and specify "don't care" (X) conditions for pins which are provided to connection to devices but which may not be used in a particular device design.

Thus, depending on counter sequence and nesting order, a portion of the address sequence might be, for example, as follows (the top three rows of the table indicating row and column addresses and the decimal number of each vector of the vector sequence then built by the invention appearing at the left):

|       | 0000000000111 ...<br>0123456789012 ...<br>RRRRRRRRRRRRR ... | 0000000000111 ...<br>0123456789012 ...<br>CCCCCCCCCCCCC ... |
|-------|-----|-----|
| 00000 | 0000000000000 ... | 0000000000001 ... |
| 00001 | 1000000000000 ... | 0000000000001 ... |
| 00002 | 0000000000000 ... | 0000000000001 ... |
| 00003 | 1000000000000 ... | 0000000000001 ... |
| 00004 | 0010000000000 ... | 0000000000001 ... |
| 00005 | 1010000000000 ... | 0000000000001 ... |
| 00006 | 0110000000000 ... | 0000000000001 ... |
| 00007 | 1110000000000 ... | 0000000000001 ... , etc. |

It will be noted that the first four vectors exercise the two addresses alternatively and the next four exercise a sequence of addresses. Thus it is seen that any address sequence can readily be accomplished by the user by specification of counter articulation and increment (or decrement) and the Boolean combinatorial function in each channel.

The above describes the development of a logical value in each vector for each address pin for a non-return-to-zero (NRZ) waveform convention. Before discussing a similar arrangement for data pins, it should be recalled that the signal waveform to express each of these logical values may take different forms based on the waveform convention embodied in the design, as discussed above. To accommodate various waveform conventions it is preferred that at least the following the following symbology can be defined and assigned for the development of the above table of vectors:

X=Don't care (high impedance, tri-state)

1=Drive pin to high level

0=Drive pin to low level

H=Receive (expect) a high level from the pin

L=Receive (expect) a low level from the pin

P=Drive positive pulse to pin

N=Drive negative pulse to pin

Thus for a return-to-zero (RZ) or return-to-complement (RC) waveform convention, the above table would be constituted with P's and N's which would control well-understood types of circuits (OR or AND gates, depending on the polarity of the clock and a level shifter for bias voltage) to gate corresponding logic level signals with a clock to develop pulses of appropriate voltages. This definition may also be applied (e.g. defined for) each channel output but it is considered preferable to define the convention as the vector is developed. For example:

NRZ—data is clocked on the rising edge of T0 and remeins until the next rising edge of T0;

RZ—data is logically ANDed with a selected clock signal;

RO—data is logically ORed the inverted selected clock line; and

RC—data is exclusive-ORed with a selected clock line. All of the above formats can preferably be defined by a few bits per bit of vector (or for selected bits of the output vector).

For the portion of the each vector to be directed to data, several more parameters must be defined. The user will usually base the data pattern on the addresses although in some cases more randomized data patterns may be desired. For example, the data pins may be associated with channels as follows:

Data 0=R0

Data 1=!R0

Data 2=R0

Data 3=!R0 . . .

Thus a sequence of data vectors developed by the write macro would be added to the above address vectors as follows:

|       | 0000000000111 ...<br>0123456789012 ...<br>RRRRRRRRRRRRR ... | 0000000000111 ...<br>0123456789012 ...<br>CCCCCCCCCCCCC ... | 0000 ...<br>0123 ...<br>DDDD ... |
|-------|-----|-----|-----|
| 00000 | 0000000000000 ... | 0000000000001 ... | 0101 ... |
| 00001 | 1000000000000 ... | 0000000000001 ... | 1010 ... |
| 00002 | 0000000000000 ... | 0000000000001 ... | 0101 ... |
| 00003 | 1000000000000 ... | 0000000000001 ... | 1010 ... |
| 00004 | 0010000000000 ... | 0000000000001 ... | 0101 ... |
| 00005 | 1010000000000 ... | 0000000000001 ... | 1010 ... |
| 00006 | 0110000000000 ... | 0000000000001 ... | 0101 ... |
| 00007 | 1110000000000 ... | 0000000000001 ... | 1010 ... |

In the corresponding read cycle (read macro), the sequence of data vectors would be:

|       | 0000000000111 ... | 0000000000111 ... | 0000 ... |
|       | 0123456789012 ... | 0123456789012 ... | 0123 ... |
|       | RRRRRRRRRRRR ...  | CCCCCCCCCCCC ...  | DDDD ... |
| 00000 | 0000000000000 ...  | 0000000000001 ... | LHLH ... |
| 00001 | 1000000000000 ...  | 0000000000001 ... | HLHL ... |
| 00002 | 0000000000000 ...  | 0000000000001 ... | LHLH ... |
| 00003 | 1000000000000 ...  | 0000000000001 ... | HLHL ... |
| 00004 | 0010000000000 ...  | 0000000000001 ... | LHLH ... |
| 00005 | 1010000000000 ...  | 0000000000001 ... | HLHL ... |
| 00006 | 0110000000000 ...  | 0000000000001 ... | LHLH ... |
| 00007 | 1110000000000 ...  | 0000000000001 ... | HLHL ... | to change the outputs to inputs.

In addition, for memories, several control clock inputs must also be provided to write to or read from the memory or to provide other necessary memory operations such as initialization and refresh as is well-understood in the art. In testing or burn-in, some of these signals such as chip select (CS), row address strobe (RAS), column address strobe (CAS) and address enable (ADD) will be active all the time whereas other signals, such as write enable (WE) and output enable (OE) will be of states unique to particular operations such as read, write, refresh and initialize programmable logic (IPL). In addition, row enable (RE) and column enable (CE) are provided for muxing when plural memory operations are carried out in a memory cycle with a multiplexer, as alluded to above. Addressing by muxing operates by using the same set of address lines to latch in both the row address and the column address in accordance with the signal on a clock pin to establish RAS (RE) and CAS (CE). Provision of these signals or not from internal clocks, as may be appropriate, may be programmed in the same manner that the data portion of the vector is provided. Preferably, the necessary clock phase waveforms are continuously provided in the system of the invention and gated to the desired pins, together with provision for driving the appropriate pins to a low or high logic state. Also, preferably, two separate counters of counters A–F are used independently to sequence through the array.

Incidentally, for refresh, at least two techniques can be provided by the invention. There are two basic refresh modes: distributive and burst. In the distributive mode, the pattern is interrupted at a specified interval by inserting one refresh address. In the burst mode, the pattern is interrupted and the whole word line count is applied. This process is repeated to maintain the integrity of data in the volatile RAM.

Returning now to FIG. 4, it will be recalled that the stability vector 412, the start-up vector 414 and the refresh macro 408 are specific to the integrated circuit device design. These vectors or sequences of vectors may be provided on any memory medium and selected, as necessary, by pattern control selector 420 for storage in the output vector pattern memory 420. Control counter 402 controls the organization of these patterns and the order of their selection with the read and write macros in accordance with timing groups provided by element 425. While only four timing groups corresponding to the initialize, read, write and refresh operations are required for practice of the invention it is considered preferable to provide at least sixteen or more timing groups since the timing groups can preferably be used to change the address range as well as the vector or macro selection between address counter rollovers. The timing groups 425 and the control counter 402 thus cause the selector 420 to function as a scheduler for the vectors and macros and counting therein into a complete, "packaged", test or burn-in sequence. The function of the scheduler is to provide a way to connect all the counters selected. It is also an arrangement for conveniently and simply changing the ripple order of the address. For example, as alluded to above, if counter A is associated with the word lines and counter B is associated with the bit lines, by simply changing the order of nesting the address can be made to ripple through either arrays of word lines or bit lines.

The timing groups are also freely programmable and a sequence of timing groups as programmed into the system of the invention by a user might be:

1 Stability vector
2 Set counter D 4 up
   Scheduler D
   timing IPL, IPL vector, data don't care
3 Write loop:
   set counter A 12 up
   set counter B 4 up
   set counter C 8 down
   set refresh interval 75
   scheduler A->B->C
   timing write, add, data
4 Read loop:
   set counter A 12 up
   set counter B 4 up
   set counter C 8 down
   set refresh interval 75
   scheduler A->B->C
   timing read, add, data
   Go to Write loop: step 3.

The above sequence of four timing groups starts with a period simulating the idle state when the stability vector is asserted. Then counter D is set to a width of four and to count up beginning at 0000, the timing is set as appropriate for initialization (during which data lines are irrelevant) and the IPL vector (e.g. start-up vector 414) is asserted. Then, counters are reset and ordered with the "scheduler" statement, a refresh interval is set (at a count or address of 75, for example, for a distributive refresh scheme) to control refresh during the execution of the write operation, and timing and relevant inputs are identified. A similar arrangement is then set to exercise the same cells during a read of the same addresses and a loop is set to repeat the write and read operations Z times. Thus a long sequence for exercising a particular portion of memory can be achieved and linked with other timing groups to exercise a digital circuit as desired.

It should be understood that the sequence of output vectors thus developed and stored in memory 430 could be applied directly to the pins of a device as read out. However, as a perfecting feature of the invention, it is considered preferable to provide vector compression 440 to receive the output of memory 430 and apply vectors to the product. In order to accommodate foreseeable integrated circuit device designs, it is preferable to provide for a relatively long vector (e.g. 256, 512, etc. bits or channels). Since some current device designs have far fewer pins (e.g. 24, 32, etc.), it is possible to specify a plurality of vectors (as will be applied to the device) as a single output vector of the pattern generator in accordance with the invention. Thus more patterns can be provided within the same memory 430. Further, since plural vectors would then be provided for each read of memory 430, vector sequencing rate can be increased for extremely high speed exercising of the device. By the same token for extremely large numbers of pins, more than one output vector could be output as a vector to the device although there would be a vector sequencing rate penalty in such a case. Additionally, in either case, arbitrary digital data compression and decompression techniques may be applied to the output vector, as stored, to effectively store larger vectors than can be accommodated in a line of memory 430 (or otherwise accessed therefrom in a single operation). Alternatively, such compression or decompression can be applied to respective portions of an output vector to increase efficiency of storage, particularly for numbers of pins which are not factors of the width of the output vector by storing such a vector as a lesser number of bits which is a factor of the output vector width.

In view of the foregoing, it is seen that the invention provides in software or hardware or a combination thereof a system for exercising either digital logic or memory integrated circuits and to provide a user with the ability to easily and efficiently specify or alter a long sequence of vectors and to specify the function, clocking and waveform for any pin of any device to be used for such a purpose in either testing or burn-in of such a circuit. By the same token, since the system of the invention is generalized and user-programmable, tooling for testing or burn-in of particular designs is minimized. Further, the control commands issued by the user form a highly compressed representation of vector sequences allowing efficient storage and retrieval for testing or burn-in of different devices.

As a further perfecting feature of the invention, the graphic user interface is preferably provided as a sequence of screens which can be manipulated to facilitate programming and storage and retrieval of vector sequences. Basically, it is the function of the user interface to facilitate sequencing of the operations illustrated in the flow chart of FIG. 5. Specifically, when operation of the invention is begun, an initial pattern generator screen is displayed. It is preferred that this screen provide a user prompt for entry of the name of the output file for storage of the input and output files which will be created by the invention. This operation is depicted at 510 of FIG. 5. When the user has performed this function, a further screen provides the user with an opportunity to import previously created input vectors for direct use. If this option is not selected, it is preferred that a main menu screen be displayed which lists further screens for particular vector manipulations in the logical order of the sequence of vectors to be generated. The operator can then iterate through these screens in order, as desired and return to any screen for further manipulations as may become necessary.

Figure 5:
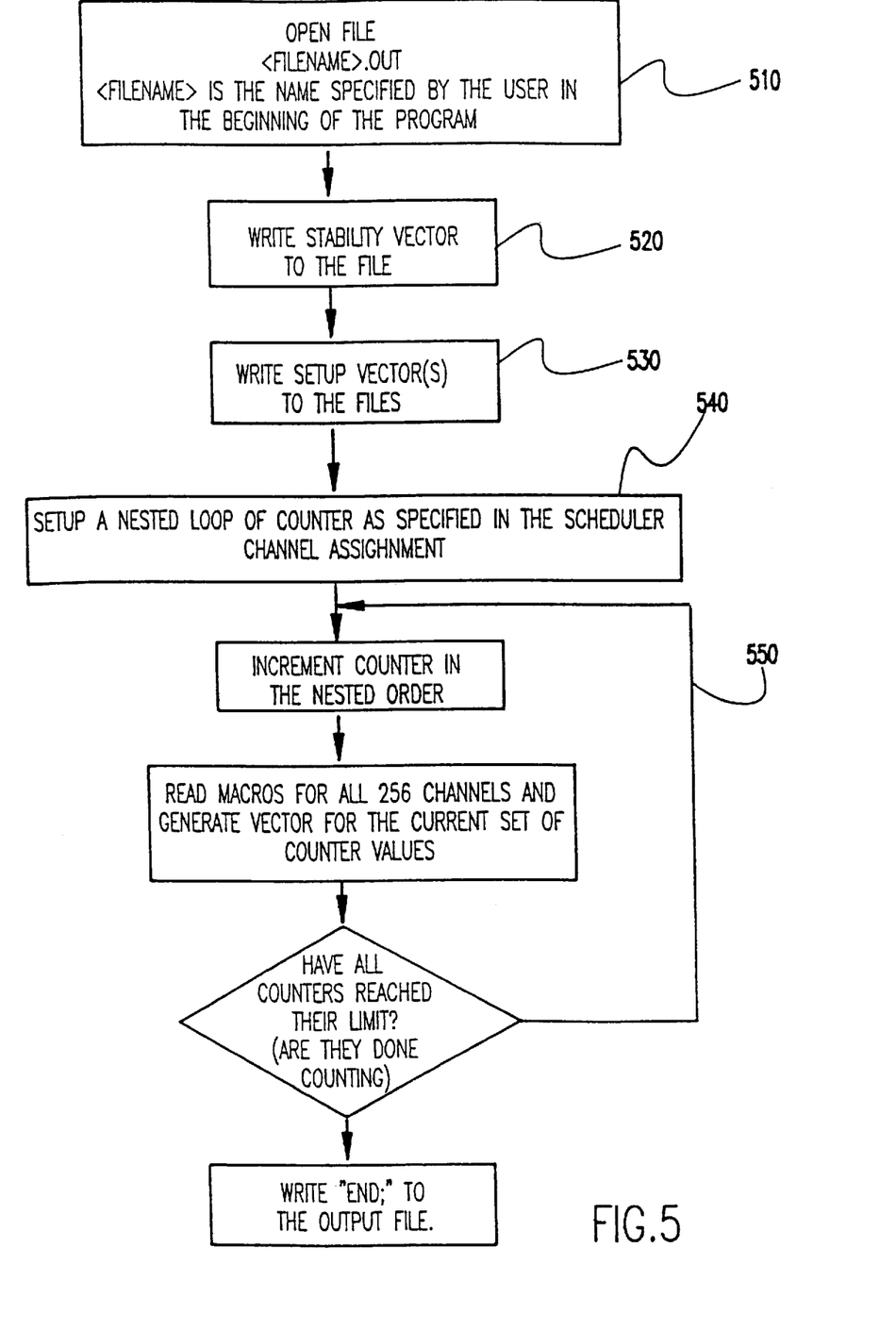
FIG. 5 is a flow diagram illustrating operation of a preferred form of the invention, including the user interface.

Specifically, a stability vector screen is first displayed and displays the individual bits of the stability vector which the operator can manipulate at will to specify 1, 0 or X for each channel as illustrated at 520 of FIG. 5. It is preferred that this screen also provide for importation of a stability vector which may have been previously generated and stored in a particular file. A similar process is performed with a subsequent screen to develop the start-up vector as illustrated at 530 of FIG. 5. If more than one start-up vector is required, it is preferred that a separate screen be provided for each in order to readily identify the particular vector being manipulated. Such screens can be dynamically created in response to user demand for additional vectors. Also, whereas the conditions 1, 0 and X were provided in the stability vector as is appropriate to the idle state, H, L, P and N can also be used in set-up vectors as the design may require.

The write counter screen is preferably provided as the next menu item from which the user can specify the counter width and function and the nesting schedule order of the counters as illustrated at 540 of FIG. 5. While default value or a previously developed set of parameters could be presented and edited, it is considered as operationally preferable, since substantial work is involved, to prevent editing of previously developed files if so selected by the user or to require that any new parameter set be entered by the user in its entirety. Once the counter parameters have been established for interaction with the write macro 404, the same operations may be performed, preferably in connection with a read counter screen, for interaction with the read macro 406. It is preferred that this screen begin with the parameters established for the write macro (automatically substituting L and H for 0 and 1 for the data pins and, if new, provide for editing so that the order of reading may be altered but monitoring, nevertheless, provided for each cell written by the write macro.

When this has been accomplished, a channel assignment screen is preferably provided in the form of an interface table. since pinouts of designs are somewhat standardized at the present time but may be modified for specific designs, editing of previously developed interface tables is preferably permitted.

Next, write macro and read macro screens are preferably provided, in sequence, each preferably as a list of pins to facilitate assignment of waveform convention values (e.g. 0, 1, H, L, P, N or X) and the Boolean operations to be performed in each channel. Appropriate clock waveforms specified in the vector are preferably generated automatically based on the operation being performed and/or whether our not and in what manner muxing is to be carried out. If desired, a refresh macro screen can then be displayed which is like the write macro and read macro screens. The principal function of this screen is to facilitate changes in a previously developed refresh macro if required by engineering design changes in a product when only minor revisions are required in the refresh macro. When all of these processes have been completed by the user, the user can so indicate and any desired checking for consistency of the users input can be performed, returning the user to the main menu or an appropriate screen when errors are found.

If no errors are found, a timing screen is preferably displayed to prompt the user to input a two digit number for each of the write, read, refresh and start-up operations. When this has been accomplished, a pattern screen is preferably provided to provide input to timing element 425.

In other words, the pattern screen selects any one of the selected timing cycles on the fly and connects them to the associated macro operations. Specifically, the user is required to specify one of four basic operations: Read array write array, Unique Address, Variable retention testing and Multiple read per address.

Figure 6:
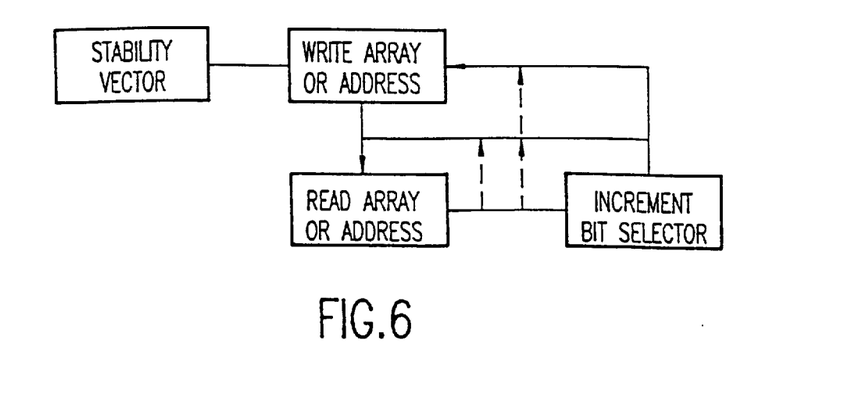
FIG. 6 is a flow diagram illustrating the development of a plurality of operations for exercising memories.

For read array—write array patterns are generated by the write macro in accordance with the counters A–F as discussed above. For Unique address, the same write and read patterns are developed as a background pattern. However, in this case, for each address four cycles are provided: write, read, write complement and read complement. These four cycles exercise each cell of the pattern through a write and erase cycle. Variable retention testing requires generation of vectors to cause a number of repetitions of a read over a background pattern after a write of the background pattern; vectors for both operations being generated in the same way as described above in response to counters A–F. The Multiple read per address operation proceeds in the same way except that vectors are generated to cause the multiple reads to be performed at each address before proceeding to the next address. Essentially, these four operations can be depicted as shown in FIG. 6 wherein, after a stability vector is asserted, the array or an address therein is written followed by a read of the address or the array. The process can be made to selectively loop to either a write of read operation as indicated and the selectivity between a specific address and an array of the device in combination with selectivity of the extent of the loop provides the four functions described above.

All of these operations cause generation of vectors under control of the write macro and timing element 425 (which also provides for inclusion of stability and set-up vectors and the refresh macro) by sequencing through loops previously specified for counters A–F as depicted at 550 of FIG. 5 which is carried out after the input to timing element 425 has been completed. As these vectors are generated, they are stored in memory 430 and are available for archival storage on any suitable medium. At the same time, the information input by the user, whether or not the preferred interface described above is employed, is also available for archival storage as an extremely compressed representation of the vectors themselves.

Accordingly, it is seen from the foregoing, that the interface and methodology of the invention provides the above-described advantages over previous hardware tools while providing great ease of use and a high degree of generality and ease of programming. The interface further provides systematic assistance to the user in such programming and results in an extremely compressed form of the vector patterns for storage and retrieval.

While the invention has been described in terms of a single preferred embodiment, those skilled in the art will recognize that the invention can be practiced with modification within the spirit and scope of the appended claims.

Having thus described my invention, what I claim as new and desire to secure by Letters Patent is as follows:

1. A system for exercising integrated circuits, comprising:
   a plurality of counters,
   means for specifying a counting function of each of said plurality of counters,
   means for providing ordered nesting of counting of said plurality of counters,
   means for simultaneously storing a plurality of macros, each of said macros combining outputs of said plurality of counters in a predetermined manner,
   means for selecting one of said plurality of macros,
   means for forming logic signals from the outputs of said plurality of counters in accordance with said selected macro,
   means for specifying a waveform convention in accordance with each of said logic signals, and
   means for outputting a vector as an input to an integrated circuit in accordance with said logic signals and said waveform convention.

2. A system as recited in claim 1, further including means for compressing said vector.

3. A system as recited in claim 1 further including means for associating each bit of said vector with a pin of said integrated circuit.

4. A system as recited in claim 1, further including means for generating a clock signal, and means for gating said clock signal to a channel included in said input to said integrated circuit.

5. A method for exercising integrated circuits including the steps of:
   specifying a counting function of each of a plurality of counters,
   providing ordered nesting of counting of said plurality of counters,
   storing, simultaneously, a plurality of macros, each of said macros combining outputs of said plurality of counters in a predetermined manner,
   selecting one of said plurality of macros,
   forming logic signals from the outputs of said plurality of counters in accordance with said selected macro,
   specifying a waveform convention in accordance with each of said logic signals, and
   outputting a vector as an input to an integrated circuit in accordance with said logic signals and said waveform convention.

6. A method as recited in claim 5, further including the step of
   compressing said vector.

7. A method as recited in claim 5 further including the step of
   associating each bit of said vector with a pin of said integrated circuit.

8. A method as recited in claim 5, further including the steps of
   generating a clock signal, and
   gating said clock signal to a channel included in said input to said integrated circuit.

9. The system of claim 1, wherein said outputting means outputs said vector for testing operability of said integrated circuit.

10. The system of claim 1, wherein said plurality of counters equals six.

11. The method of claim 5, wherein said vector is input into an integrated circuit for testing operability of the integrate circuit.

12. The method of claim 11 wherein said selected macro combines the outputs of said counters to form a plurality of patterns;
   storing said plurality of patterns in a memory; and
   reading said plurality of patterns from said memory in a predefined sequence to form said vector.

13. A system for exercising integrated circuits, comprising:
   a plurality of counters;
   a circuit which specifies a counting function for each of said plurality of counters;
   a circuit which nests counting of said plurality of counters according to a predetermined order;
   a circuit which simultaneously stores a plurality of macros, each of said macros combining outputs of said plurality of counters in a predetermined manner,
   a circuit which selects one of said plurality of macros,
   a circuit which forms logic signals from outputs of said plurality of counters in accordance with said selected macro, a circuit which specifies a waveform; and a circuit which derives a vector for testing an integrated circuit, said vector being derived based on said logic signals and said waveform.

14. The system of claim 13, further comprising:

a circuit which combines the outputs of said plurality of counters to form a plurality of patterns:

a memory for storing said plurality of patterns; and a circuit which reads said plurality of patterns from said memory according to a predefined sequence.

15. A system as recited in claim 1, further comprising:

means for pre-programming said plurality of macros, said pre-programming means including interface means for allowing one or more parameters of at least one of said plurality of macros to be entered by a user so that the outputs of said plurality of counters are combined in said predetermined manner.

16. A system as recited in claim 1, wherein said selecting means combines the outputs of said plurality of counters to form a plurality of patterns, and wherein said forming means includes means for reading out said patterns from a memory in a predefined sequence.

17. A method as recited in claim 5, further comprising:

pre-programming said plurality of macros in accordance with steps which include allowing a user to alter at least one parameter of at least one of said plurality of macros so that the outputs of said plurality of counters are combined in said predetermined manner.

18. A system as recited in claim 13, further comprising:

an interface for allowing one or more parameters of at least one of said plurality of macros to be entered by a user so that the outputs of said plurality of counters are combined in said predetermined manner.

* * * * *